(12) United States Patent
Chen

(10) Patent No.: US 6,267,254 B1
(45) Date of Patent: Jul. 31, 2001

(54) MOTHER BOARD TRAY ASSEMBLY

(75) Inventor: Chia Hua Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/474,577

(22) Filed: Dec. 29, 1999

(30) Foreign Application Priority Data

Sep. 23, 1999 (TW) .................................................. 88216269

(51) Int. Cl.⁷ ........................................................... H05K 5/00
(52) U.S. Cl. ........................... 211/26; 361/683; 312/223.2
(58) Field of Search ................................. 211/26; 361/683, 361/748, 752; 312/223.2

(56) References Cited

U.S. PATENT DOCUMENTS

| | | | |
|---|---|---|---|
| 5,124,885 | * | 6/1992 | Liu . |
| 5,136,468 | * | 8/1992 | Wong et al. . |
| 5,661,640 | * | 8/1997 | Mills et al. . |
| 5,839,584 | * | 11/1998 | Gonsalves et al. ................. 211/26 X |
| 5,973,918 | * | 10/1999 | Felcman et al. ...................... 361/683 |
| 6,052,277 | * | 4/2000 | Liu et al. ....................... 312/223.2 X |
| 6,094,351 | * | 7/2000 | Kikinis .............................. 361/683 X |
| 6,097,591 | * | 8/2000 | Ircha .................................... 361/683 |

* cited by examiner

Primary Examiner—Robert W. Gibson, Jr.
(74) Attorney, Agent, or Firm—Wei Te Chung

(57) ABSTRACT

A mother board tray assembly includes a base, a fastener movably attached to the base and a mother board tray fixed to the base. The base is adapted for attaching to a box and defines a first wide slot. The fastener has a latch for extending through the first wide slot of the base. The mother board tray engages with the latch of the fastener and is adapted for mounting a mother board thereon.

10 Claims, 6 Drawing Sheets

MOTHER BOARD TRAY ASSEMBLY

BACKGROUND OF THE INVENTION

1. Field of the Invention

The present invention relates to a mother board tray assembly, and particularly to a mother board tray assembly incorporating a fastener for readily fixing a mother board tray thereto.

2. The Related Art

A computer enclosure generally includes a box and a mother board tray incorporated to a side wall of the box for mounting a mother board thereon. A conventional mother board tray is fixed to the box before a mother board is attached thereto. The box complicates the operation of mounting the mother board to the tray fixed in the box. This requires a large amount of space inside the box for mounting the mother board to the tray, thus increasing the size of the computer enclosure.

To solve the problem mentioned above, a mother board tray is attached to a box after a mother board is mounted thereon, as disclosed in Taiwan Patent Application Nos. 84201628 and 84214655. However, the structure of the mother board tray is complicated and uneasily manufactured, and attaching the mother board tray to the box is complicated.

Thus, it is desired to have a mother board tray assembly which facilitates mounting a mother board thereon for readily attaching to a box.

SUMMARY OF THE INVENTION

Accordingly, an object of the present invention is to provide a mother board tray assembly for facilitating mounting a mother board thereon.

Another object of the present invention is to provide a mother board tray assembly for readily attached to a box.

To fulfill the objects mentioned above, a mother board tray assembly in accordance with the present invention comprises a base, a fastener movably attached to the base and a mother board tray fixed to the base. The base is adapted for attaching to a box and defines a pair of first wide slots. The fastener has a pair of latches for extending through the first wide slots of the base. The mother board tray engages with the latches of the fastener and is adapted for mounting of a mother board thereon.

Other objects and advantages of the present invention will be understood from the following description of a preferred embodiment according to attached drawings of the present invention.

DETAILED DESCRIPTION OF THE PREFERRED EMBODIMENT

Figure 1:
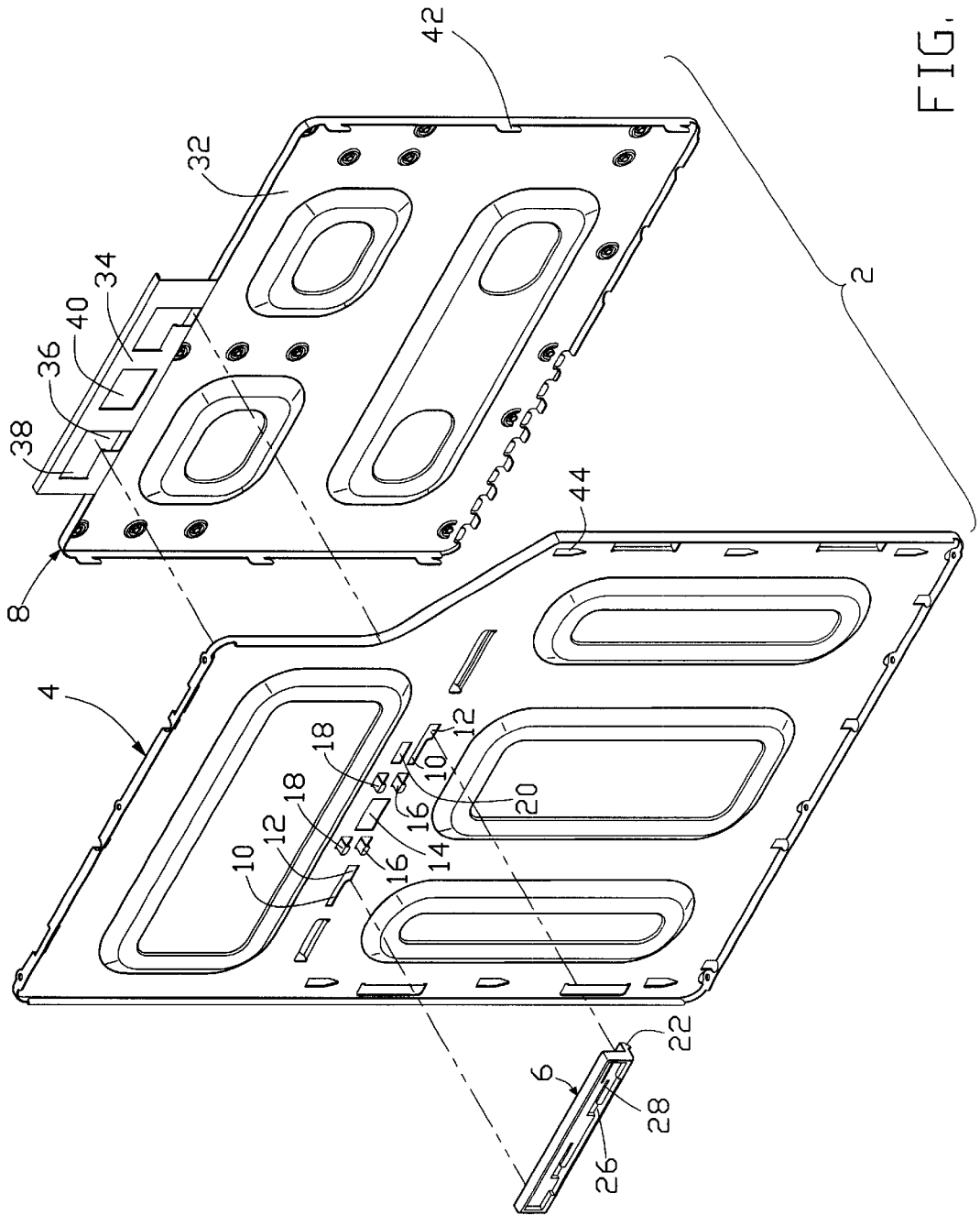
FIG. 1 is an exploded view of a mother board tray assembly of the present invention.

Referring to FIGS. 1–4, a mother board tray assembly 2 in accordance with the present invention includes a base 4 for attaching to a box (not shown), a fastener 6 securing to the base 4 and a mother board tray 8 mounted on the base 4 and fixed by the fastener 6. The base 4 defines a pair of first narrow slots 10 and a pair of first wide slots 12 in communication with the narrow slots 10. A first rectangular hole 14 is defined between the first narrow slots 10 and spaced away from the first narrow slots 10. A pair of first bent tabs 16 is formed on respective opposite sides of the first rectangular hole 14 between the first narrow slots 10 and the first rectangular hole 14. A pair of second bent tabs 18 parallel to and above to the first bent tabs 16 is formed on respective opposite sides of the first rectangular hole 14. A positioning hole 20 above one first narrow slot 10 is defined in the base 4. Six appertures 44 are respectively defined at opposite sides of the base 4.

The fastener 6 includes a pair of latches 22 extending from opposite ends thereof for extending through the first wide slots 12 and moving along the first narrow slots 10 of the base 4. An actuating protrusion 24 is formed between the latches 22 for being movably received in the first rectangular hole 14. The fastener 6 defines a pair of second wide slots 26 for extension of the first bent tabs 16 there through, and a pair of second narrow slots 28 in communication with the second wide slots 26 for movably engaging with the first bent tabs 16. A resilient positioning protrusion 30 is formed at an end of the fastener 6 for being movably received in the positioning hole 20 of the base 4.

The mother board tray 8 includes a body 32 for mounting a mother board (not shown) thereon, and an ear 34 extending from the body 32. The ear 34 defines a pair of third wide slots 36 for extension of the latches 22 of the faster 6 there through and a pair of third narrow slots 38 in communication with the third wide slots 36 for movably engaging with the latches 22 of the fastener 6. A second rectangular hole 40 is defined between the third narrow slots 38 for receiving the actuating protrusion 24 of the fastener 6. Six hooks 42 respectively extend from opposite side edges of the body 32 of the mother board tray 8 for engaging with the appertures 44 of the base 4.

Figure 2:
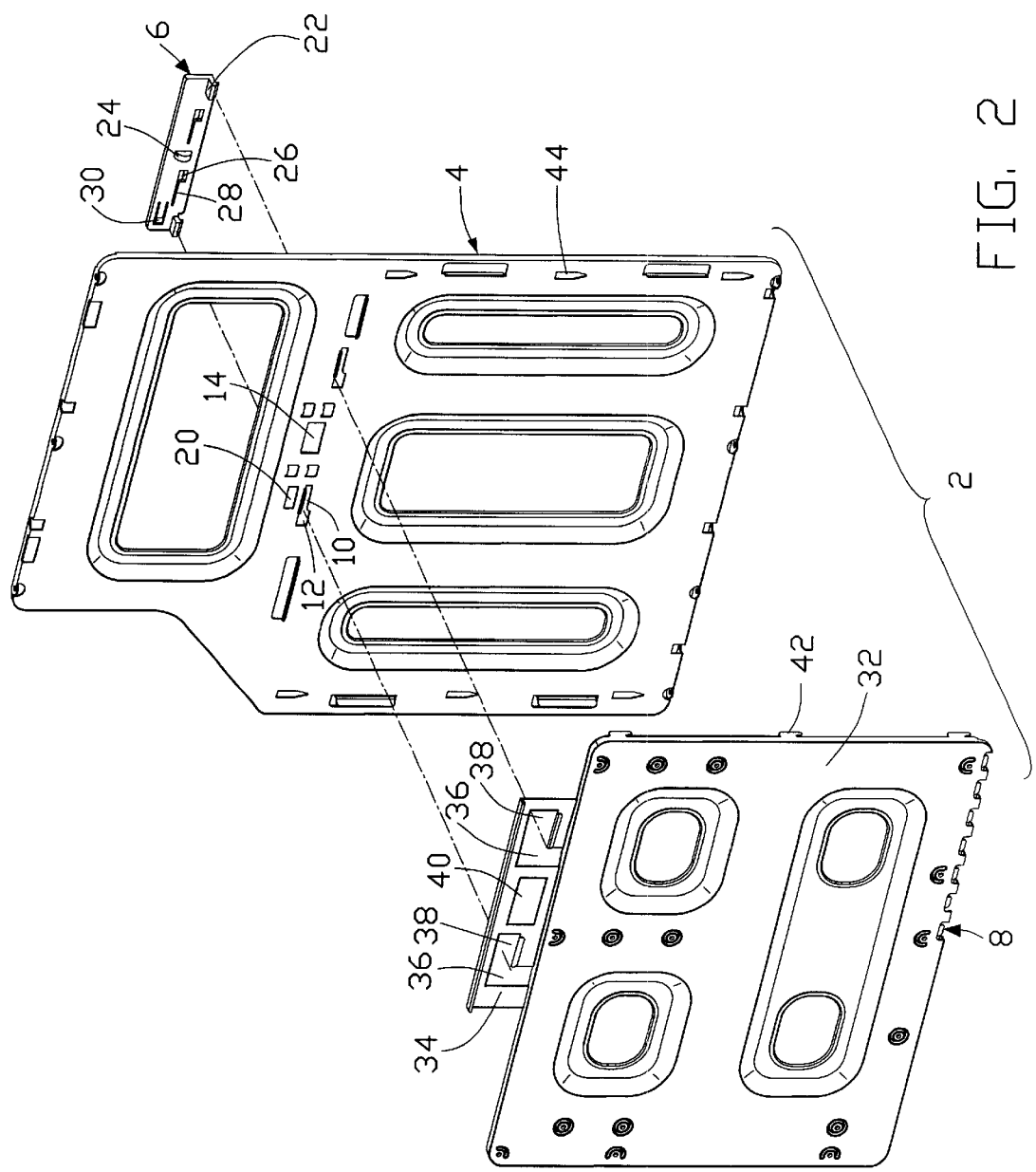
FIG. 2 is another view of the mother board tray assembly of FIG. 1.
Figure 3:
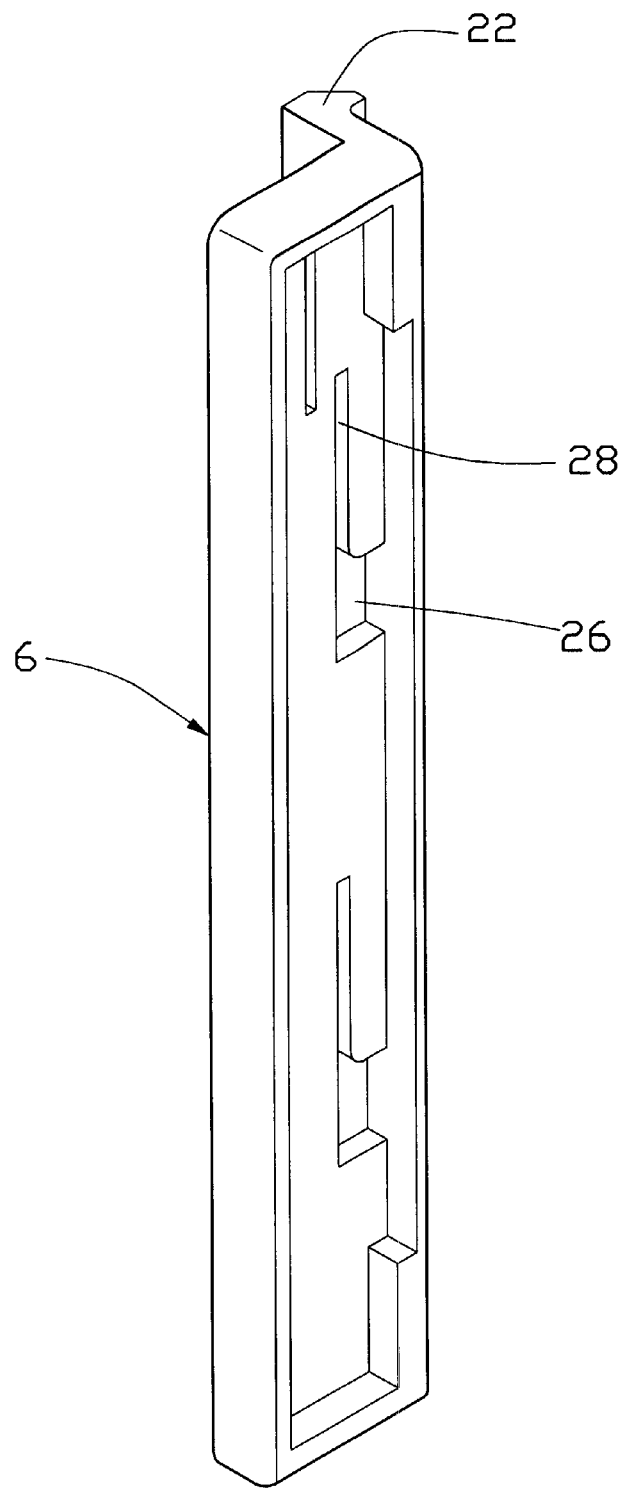
FIG. 3 is a perspective view of a fastener of the present invention.
Figure 4:
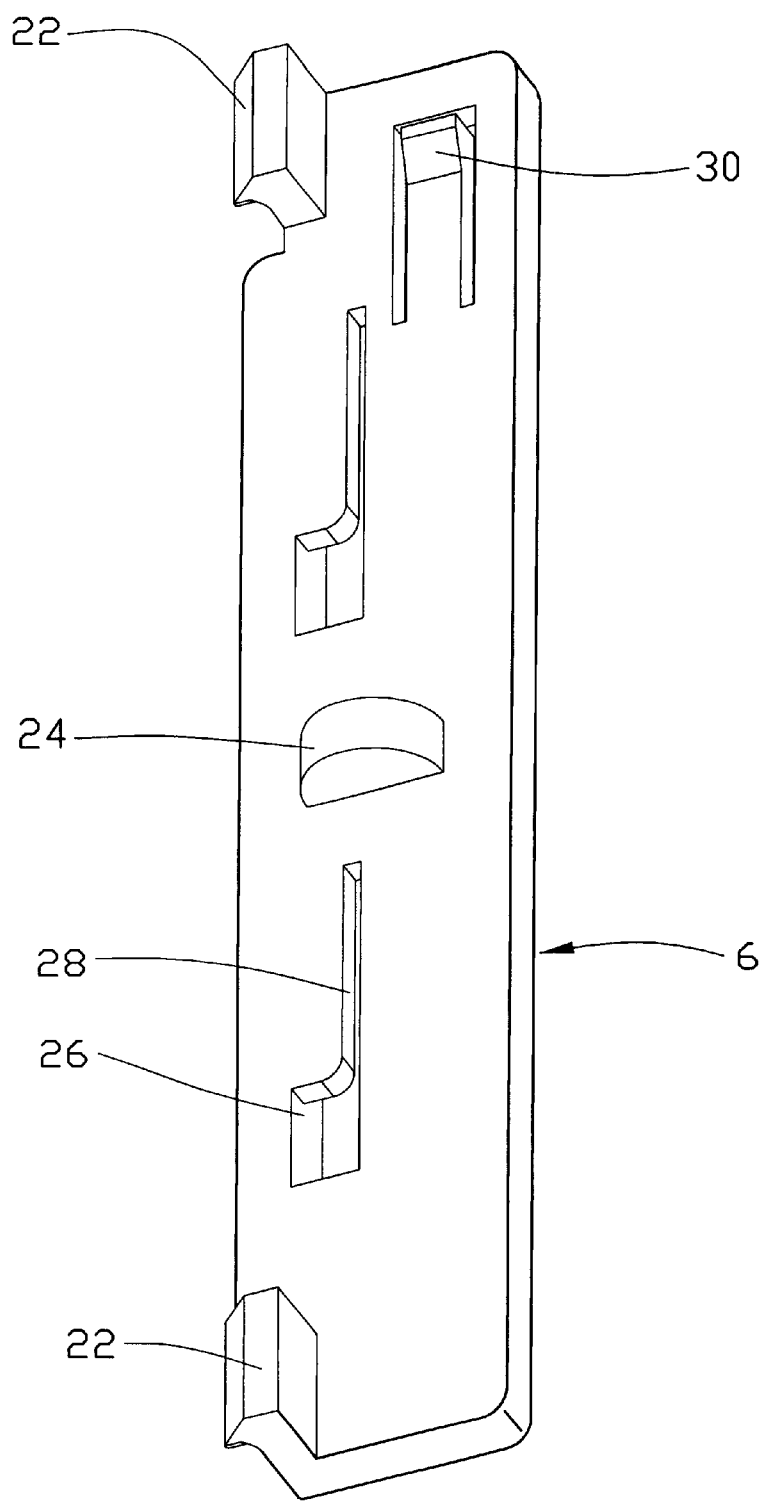
FIG. 4 is another view of FIG. 3.
Figure 5:
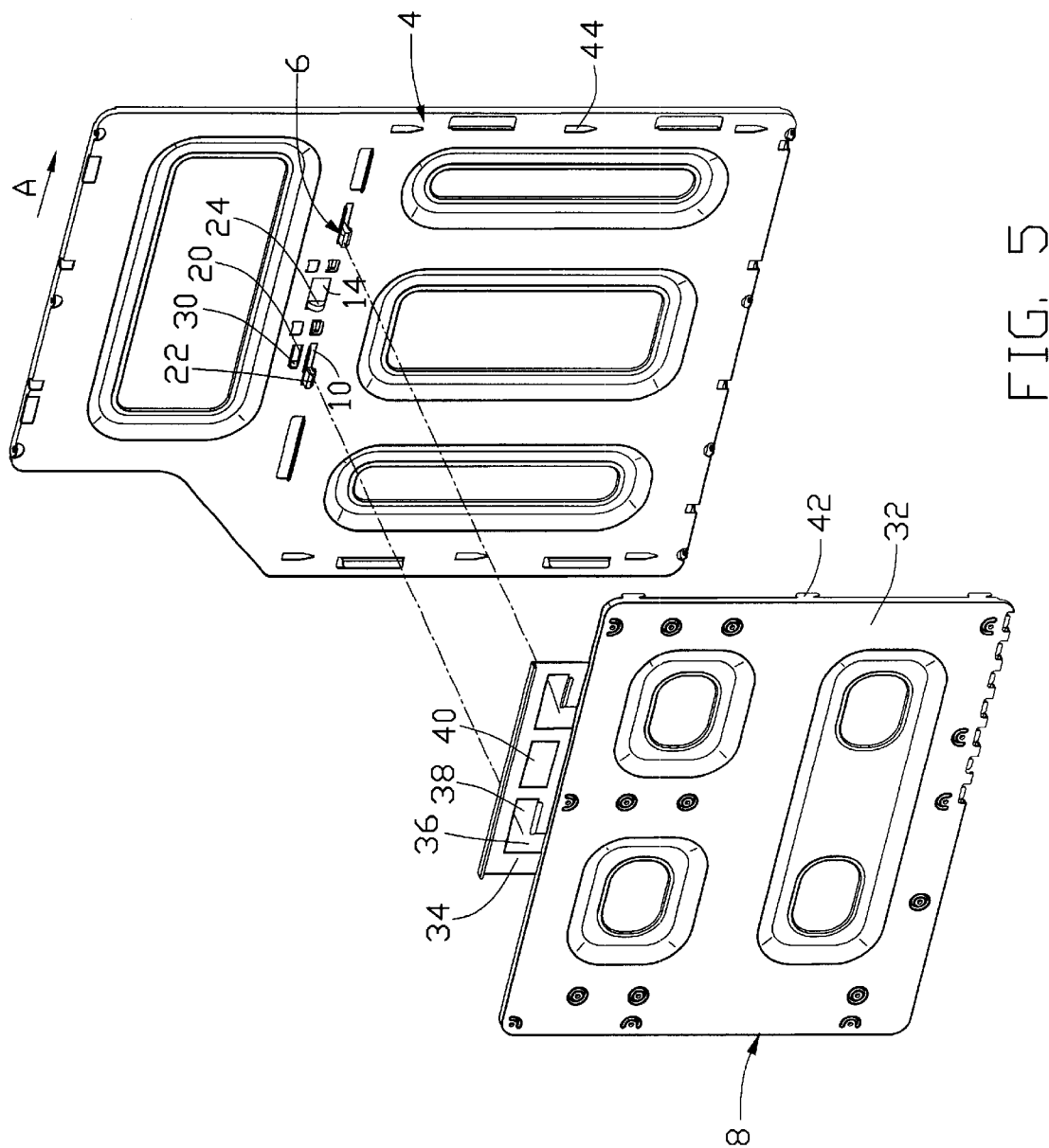
FIG. 5 is a partially assembled view of the mother board tray assembly of FIG. 2.
Figure 6:
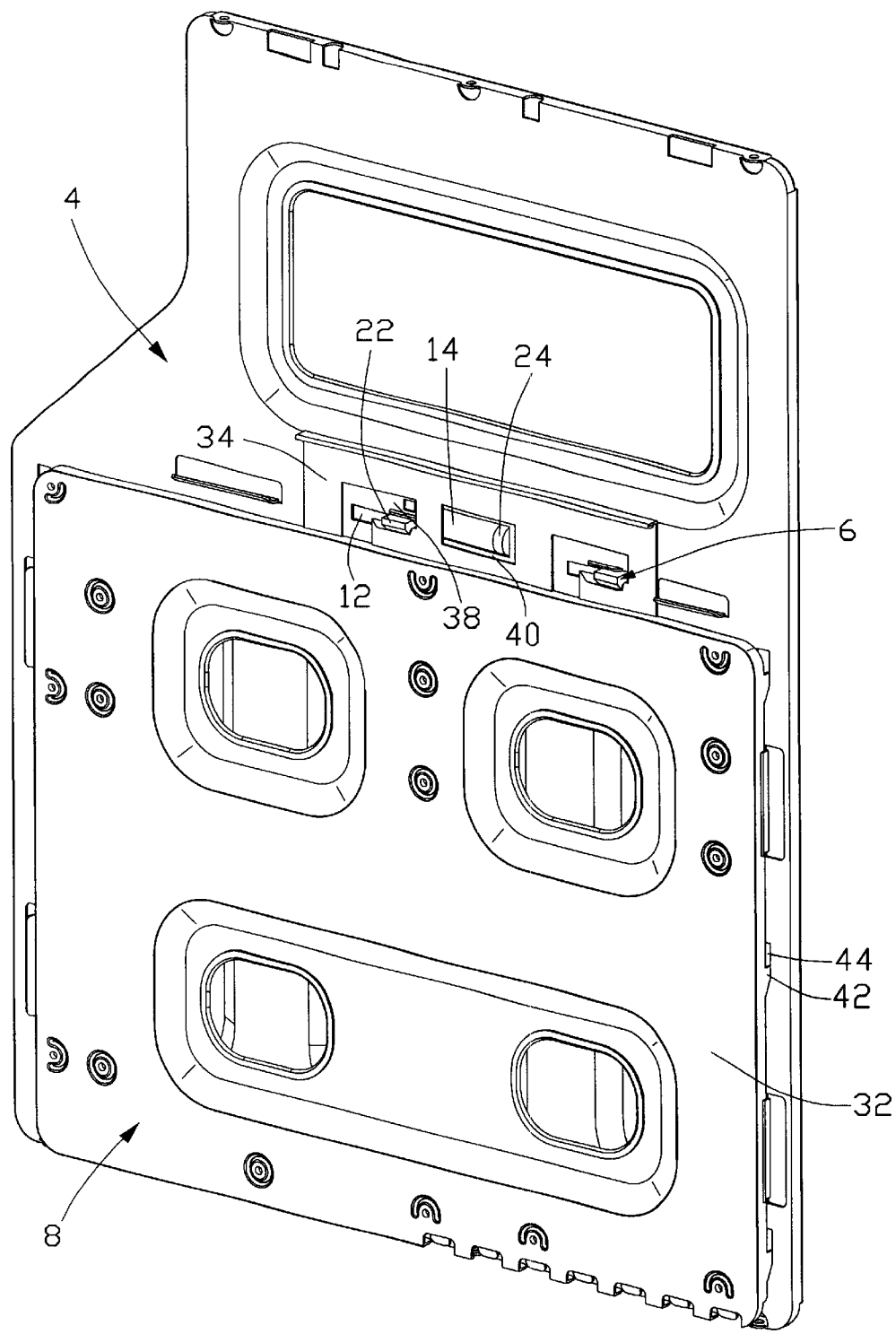
FIG. 6 is an assembled view of FIG. 2.

Referring to FIGS. 2, 5 and 6, in assembly, the mother board tray 8 is mounted on the base 4 and then secured by the fastener 6. Firstly, the latches 22 of the fastener 6 extend through the first and the third wide slots 12, 36 of the base 4 and the mother board tray 8 respectively, and the first bent tabs 16 of the base 4 extend through the second wide slots 26 of the fastener 6. Simultaneously, the second bent tabs 18 of the base 4 engagingly abut against the fastener 6. The actuating protrusion 24 of the fastener 6 extends through the first and the second rectangular holes 14, 40 of the base 4 and the mother board tray 8. The positioning protrusion 30 of the fastener 6 is received in a first half portion of the positioning hole 20 of the base 4.

Then, the fastener 6 is moved along direction A (see FIG. 5) by exerting a force on the actuating protrusion 24 thereof, until the positioning protrusion 30 thereof is moved into a second half portion of the positioning hole 20 of the base 4. Simultaneously, each latch 22 of the fastener 6 is moved along the first and the third narrow slots 10, 38 of the base 4 and the mother board tray 8 respectively to finally abut the body 32 at end of each third narrow slot 38 thereby fixing the mother board tray 8 to the base 4. Each first bent tab 16 of the base 4 is finally received in the second narrow slot 28 of the fastener 6. Thus, the assembly of attaching the mother board tray 8 to the base 4 is easily achieved.

In use, the base 4 with the fastener 6 is attached to the box. The mother board tray 8 is attached to the base 4 and fixed by the fastener 6 after a mother board has been mounted thereon. Thus, the mother board tray assembly 2 facilitates mounting the mother board thereon and is readily attached to the box. To detach the mother board tray 8 with the mother board from the base 4, a reverse procedure may be taken by exerting a second force opposite to the direction A of the first force to the actuating protrusion 24. Therefore, it can be appreciated that the use of mother board tray 8 facilitates both assembly and disassembly of the mother board to/from the box.

It will be understood that the present invention may be embodied in other forms without departing from the spirit thereof. The present example and embodiment, therefore, is to be considered in all respects as illustrative and not restrictive, and the invention is not to be limited to the details given herein.

What is claimed is:

1. A mother board tray assembly comprising:
   a base adapted for attaching to a box and including a first wide slot, a first narrow slot in communication with the first wide slot, and a first bent tab;
   a fastener movably attached to the base, the fastener having a latch for extending through the first wide slot of the base and for being received in the first narrow slot, a second wide slot for extension of the first bent tab therethrough, and a second narrow slot in communication with the second wide slot for releasably engaging with the first bent tab; and
   a mother board tray engaging with the latch of the fastener and fixed to the base, the mother board tray being adapted for mounting a mother board thereon.

2. The mother board tray assembly as described in claim 1, wherein an actuating protrusion is formed on the fastener first and second rectangular holes are defined in the base and the mother board tray for providing access to the actuating protrusion, and the actuating protrusion is movably received in the rectangular holes.

3. The mother board tray assembly as described in claim 1, wherein the base is formed with a second bent tab for engaging with the fastener.

4. The mother board tray assembly as claimed in claim 1, wherein the mother board tray includes a third wide slot for extension of the latch of the fastener and a third narrow slot in communication with the wide slot for movably engaging with the latch.

5. The mother board tray assembly as described in claim 1, wherein a positioning hole is defined in the base, and wherein a positioning protrusion is formed at the fastener for being movably received in the positioning hole.

6. A mother board tray assembly comprising:
   a base;
   a mother board tray attached to said base in a parallel relation;
   a fastener engaged with both the mother board tray and the base for preventing the mother board tray from being withdrawn from the base;
   first means for assembling the mother board tray to the base along a first direction and then a second direction perpendicular to said first direction; and
   second means for assembling the fastener to both the base and the mother board tray along a direction opposite to said first direction and then a third direction perpendicular to said second direction.

7. The assembly as described in claim 6, wherein said first means includes hooks formed on one of said base and said mother board tray, and apertures formed in the other of said base and said mother board tray.

8. The assembly as described in claim 6, wherein said second means includes wide and narrow slots formed in both the base and the mother board tray, and a latch formed on the fastener.

9. The assembly as described in claim 6, wherein said base is sandwiched between the mother board tray and the fastener.

10. The assembly as described in claim 6, wherein said fastener further includes a resilient positioning protrusion to cooperate with a positioning hole in the base for retaining the fastener in position with regard to the base.

\* \* \* \* \*